(12) United States Patent
Nebesnyi

(10) Patent No.: US 9,660,627 B1
(45) Date of Patent: May 23, 2017

(54) SYSTEM AND TECHNIQUES FOR REPEATING DIFFERENTIAL SIGNALS

(71) Applicant: Bitfury Group Limited, George Town, Grand Cayman (KY)

(72) Inventor: Valerii Nebesnyi, Kiev (UA)

(73) Assignees: Bitfury Group Limited (KY); Valerijs Vavilovs (LV)

( * ) Notice: Subject to any disclaimer, the term of this patent is extended or adjusted under 35 U.S.C. 154(b) by 0 days.

(21) Appl. No.: 14/988,371

(22) Filed: Jan. 5, 2016

(51) Int. Cl.
G06F 1/10 (2006.01)
H04L 25/24 (2006.01)
H03K 5/151 (2006.01)
H03K 19/0185 (2006.01)
H04L 25/02 (2006.01)

(52) U.S. Cl.
CPC ............. H03K 5/1515 (2013.01); G06F 1/10 (2013.01); H03K 19/018528 (2013.01); H04L 25/0272 (2013.01); H04L 25/242 (2013.01)

(58) Field of Classification Search
CPC ............. H03K 5/1515; H03K 19/0175; H03K 19/017509; H03K 19/0185–19/018528; H04L 25/0272; H04L 25/20; H04L 25/24; H04L 25/242; G06F 1/10
See application file for complete search history.

(56) References Cited

U.S. PATENT DOCUMENTS

| | | | |
|---|---|---|---|
| 5,867,040 A | 2/1999 | Fuse et al. | |
| 6,097,811 A | 8/2000 | Micali | |
| 6,479,974 B2 | 11/2002 | Cohn et al. | |
| 6,657,474 B2 * | 12/2003 | Varadarajan | G06F 1/10 327/291 |
| 6,774,721 B1 | 8/2004 | Popescu et al. | |

(Continued)

FOREIGN PATENT DOCUMENTS

WO WO-2014/201059 A1 12/2014
WO WO-2015/077378 A1 5/2015

(Continued)

OTHER PUBLICATIONS

Paul D. Franzon, ECE 733 Class Notes: Latches and Flip Flops (2012), available at http://www.ece.ncsu.edu/asic/ece733/2013/docs/FlipFlops.pdf pp. 1-81.

(Continued)

Primary Examiner — Patrick O'Neill
(74) Attorney, Agent, or Firm — Goodwin Procter LLP

(57) ABSTRACT

Techniques and devices for differential signal repeating are described. A differential signal repeating method may include receiving an input differential signal pair including first and second input signals received at first and second input terminals, respectively, and generating an output signal at an output terminal. Generating the output signal may include: based on a determination, at a first time, that the first and second input signals represent complementary values, setting a level of the output signal to represent an inverse of the value represented by the first input signal, and based on a determination, at a second time, that the first and second input signals do not represent complementary values, placing the output terminal in a high-impedance state.

26 Claims, 4 Drawing Sheets

(56) References Cited

U.S. PATENT DOCUMENTS

| | | | |
|---|---|---|---|
| 7,193,443 B1 * | 3/2007 | Smith | H03K 19/01852 326/27 |
| 7,236,518 B2 | 6/2007 | Bazes | |
| 7,329,968 B2 | 2/2008 | Shepard et al. | |
| 7,373,527 B2 | 5/2008 | Chapuis | |
| 7,493,504 B2 | 2/2009 | Chapuis | |
| 7,562,326 B2 | 7/2009 | Wang et al. | |
| 7,594,127 B2 | 9/2009 | Sutardja | |
| 7,643,591 B2 | 1/2010 | Arsovski et al. | |
| 7,702,929 B2 | 4/2010 | Sutardja | |
| 7,707,521 B2 | 4/2010 | Tsai et al. | |
| 7,710,192 B2 | 5/2010 | Kaeslin et al. | |
| 7,788,509 B2 | 8/2010 | Sutardja | |
| 7,788,510 B2 | 8/2010 | Sutardja | |
| 7,823,107 B2 | 10/2010 | Arsovski et al. | |
| 7,937,605 B2 | 5/2011 | Rea et al. | |
| 8,122,279 B2 | 2/2012 | Yamaoka | |
| 8,166,286 B2 | 4/2012 | Frank et al. | |
| 8,169,257 B2 | 5/2012 | Pelley | |
| 8,174,288 B2 | 5/2012 | Dennard et al. | |
| 8,274,319 B2 | 9/2012 | Maeno | |
| 8,605,845 B2 | 12/2013 | Chen et al. | |
| 8,624,646 B1 | 1/2014 | Bazes | |
| 8,742,464 B2 | 6/2014 | Sherlekar et al. | |
| 8,754,672 B2 | 6/2014 | Dennard et al. | |
| 8,797,084 B2 | 8/2014 | Friedman et al. | |
| 8,836,379 B2 | 9/2014 | Guntur et al. | |
| 8,856,704 B2 | 10/2014 | Baeg | |
| 8,875,082 B1 | 10/2014 | Sircar et al. | |
| 8,878,387 B1 | 11/2014 | Wong et al. | |
| 8,918,667 B2 | 12/2014 | Ware et al. | |
| 8,941,150 B2 | 1/2015 | Sherlekar et al. | |
| 9,008,251 B2 | 4/2015 | Chen et al. | |
| 9,048,820 B2 | 6/2015 | Shi et al. | |
| 9,158,877 B2 | 10/2015 | Hsieh et al. | |
| 9,197,090 B2 | 11/2015 | Chao et al. | |
| 9,207,695 B2 | 12/2015 | Friedman et al. | |
| 2004/0076189 A1 | 4/2004 | Boerstler et al. | |
| 2008/0061835 A1 | 3/2008 | Locatelli et al. | |
| 2008/0116943 A1 * | 5/2008 | Nair | H03K 19/01852 327/108 |
| 2008/0246511 A1 * | 10/2008 | Miura | H03F 3/45179 326/83 |
| 2009/0044163 A1 | 2/2009 | Wang et al. | |
| 2011/0145137 A1 | 6/2011 | Driemeyer et al. | |
| 2011/0246774 A1 | 10/2011 | Phillips, II et al. | |
| 2011/0307659 A1 | 12/2011 | Hans et al. | |
| 2013/0032885 A1 | 2/2013 | Swamynathan et al. | |
| 2014/0258765 A1 | 9/2014 | Persson | |
| 2014/0327081 A1 | 11/2014 | Hsieh et al. | |
| 2015/0015314 A1 | 1/2015 | Dally | |
| 2015/0168973 A1 | 6/2015 | Barber | |
| 2015/0294308 A1 | 10/2015 | Pauker et al. | |
| 2015/0370947 A1 | 12/2015 | Moroz et al. | |

FOREIGN PATENT DOCUMENTS

| | | |
|---|---|---|
| WO | WO-2015/095367 A2 | 6/2015 |
| WO | WO-2015/160565 A1 | 10/2015 |

OTHER PUBLICATIONS

Daniel Wiklund, Mesochronous clocking and communication in on-chip networks, Proc. Swedish System-on-Chip Conf. (Apr. 2003), 4 pages.

J.M. Rabaey et al., Digital Integrated Circuits: A Design Perspective, Second Edition (2003), pp. 346-349 and 519-534.

U.S. Appl. No. 14/988,658, filed Jan. 5, 2016, Circuits and Techniques for Mesochronous Processing, Valerii Nebesnyi.

U.S. Appl. No. 14/988,502, filed Jan. 5, 2016, Layouts of Transmission Gates and Related Systems and Techniques, Valerii Nebesnyi.

* cited by examiner

SYSTEM AND TECHNIQUES FOR REPEATING DIFFERENTIAL SIGNALS

FIELD OF INVENTION

The present disclosure relates generally to systems and techniques for repeating differential signals. Some implementations relate specifically to differential signal repeater circuits operable to prevent, counteract, and/or correct skewing of differential signals, and/or to equalize differential signals.

BACKGROUND

Differential signaling circuits can use a pair of complementary signals to transmit data. The pair of signals are generally transmitted using respective electrical conductors. A receiver can decode data carried by the pair of signals by measuring a difference (e.g., a potential difference) between the two signals, instead of measuring a difference between a signal and a reference point (e.g., between the signal's potential and a reference potential or "ground"). Differential signaling circuits can also be used for transmitting differential clock signals.

In an integrated circuit (IC), data and clock signals can be transmitted between different blocks at different locations of the chip using conductive wires (e.g., metal lines and/or vias). To reduce the time delay associated transmitting a signal between two blocks of the chip (e.g., two blocks at opposite ends of the chip), one or more repeaters (e.g., signal buffers and/or inverters) can be inserted into the transmission path, rather than simply inserting a long wire. Each repeater can reproduce its input signal(s) at a higher level (e.g., higher voltage at the output of the repeater than at the input of the repeater), or can restore the input signal(s) to a nominal level. In this way, the repeaters divide the transmission path into several segments of shorter wires separated by repeaters, which together can have a shorter total time delay than the time delay associated with the long wire.

When a signal is transmitted over a medium (e.g., conductive wires) from a transmitter to a receiver, sources of distortion (e.g., signal interference, impedance mismatch, or the medium itself) may cause distortion in the received signal at the receiver. For instance, the received signal can have a different frequency profile from the original signal at the transmitter. As another example, when a pair of differential signals are transmitted over a medium from a transmitter to a receiver, sources of distortion may cause skewing between the two signals, such that the two signals do not switch at the same time (or within a specified time window) at the receiver. Signal equalization techniques are used to prevent, counteract, or reduce the distortion introduced into a signal during its propagation through a medium. For example, de-skewing techniques are used to prevent, counteract, or reduce the skew between the switching times of two or more signals.

SUMMARY OF THE INVENTION

In general, integrated circuits (ICs) continue to increase in size, while the feature sizes of IC components continue to decrease and the frequencies of the clock signals used to synchronize the operation of IC components continue to increase. As a result of these trends, distributing a clock signal throughout an IC or even a portion of an IC has become increasingly difficult. For example, the distorting effects of IC fabrication process variations on the propagation of the clock signal tend to increase as feature sizes decrease, and distortions of the clock signal tend to increase as the ratio of the distance traveled by the clock signal to the clock signal's period increases.

Conventionally, ICs have used long chains of amplifiers (e.g., inverters) to distribute clock signals. However, as clock frequencies and clock signal distortions (e.g., clock skew) increase, the performance of these conventional clock trees tends to suffer. In particular, for high-frequency clock signals in ICs with feature sizes of 28 nm or less, conventional clock trees can produce a very distorted clock signal after a relatively short chain of inverters (e.g., 50 inverters) unless the inverters are very large and powerful. However, a clock tree with large and powerful inverters is generally undesirable, because such a clock tree (1) consumes a significant amount of power, and (2) takes up valuable IC space that could otherwise be devoted to processing circuitry.

There is a need for a low-power clock distribution circuit that can propagate a high-frequency clock signal over a relatively long distance (e.g., from one side of an IC to the opposite side of the IC) without introducing significant signal distortion, even in ICs with feature sizes of 28 nm or less. The inventors have recognized and appreciated that a differential clock signal can be distributed using a chain of differential clock repeaters as described in the present disclosure. Each differential clock repeater can provide output differential clock signals (CLKPQ, CLKNQ) based on the values of input differential clock signals (CLKP, CLKN). When the input differential clock signals represent complementary logical values, the differential clock repeater can provide output differential clock signals that also represent complementary values. In some embodiments, the differential signal repeater can switch the output differential signals simultaneously (or within a specified time window) in response to both input differential signals switching, even if the two input signals do not switch simultaneously (or within a specified time window). In some embodiments, a clock tree that includes differential clock repeaters as described herein may be capable of propagating a high-frequency differential clock signal over a relatively long distance without introducing significant signal distortion and without consuming significant power, even in ICs with feature sizes of 28 nm or less.

According to an aspect of the present disclosure, a differential signal repeating method is provided. The method includes receiving an input differential signal pair including first and second input signals received at first and second input terminals, respectively, and generating an output signal at an output terminal. Generating the output signal includes, based on a determination, at a first time, that the first and second input signals represent complementary values, setting a level of the output signal to represent an inverse of the value represented by the first input signal, and based on a determination, at a second time, that the first and second input signals do not represent complementary values, placing the output terminal in a high-impedance state.

In some embodiments, the output signal is a first output signal, the output terminal is a first output terminal, and the method further includes generating a second output signal at a second output terminal. Generating the second output signal includes, based on a determination that the first and second input signals represent complementary values, setting a level of the second output signal to represent an inverse of the value represented by the second input signal, and based on a determination that the first and second input signals do not represent complementary values, placing the second output terminal in a high-impedance state. In some embodiments, the first and second output signals form an output differential signal pair. In some embodiments, generating the output differential signal pair counteracts skewing of the output differential signal pair.

In some embodiments, the levels of the output signals are voltage levels, and the method further includes at least partially equalizing the voltage levels of the first and second output signals. In some embodiments, at least partially equalizing the voltage levels of the first and second output signals is performed based on a determination that the first and second input signals do not represent complementary values. In some embodiments, at least partially equalizing the voltage levels of the first and second output signals includes coupling the first output terminal to the second output terminal. In some embodiments, at least partially equalizing the voltage levels of the first and second output signals counteracts skewing of the first and second output signals.

According to another aspect of the present disclosure, a system including a signal repeater circuit is provided. The signal repeater circuit includes a first field effect transistor (FET) of a first type and second and third FETs of a second type. A gate of the first FET is coupled to a gate of the second FET, a drain of the first FET is coupled to a drain of the second FET and to a gate of the third FET, and sources of the second and third FETs are coupled to a first power supply rail. The signal repeater circuit also includes a fourth FET of the second type and fifth and sixth FETs of the first type. A gate of the fourth FET is coupled to a gate of the fifth FET, a drain of the fourth FET is coupled to a drain of the fifth FET and to a gate of the sixth FET, and sources of the fifth and sixth FETs are coupled to a second power supply rail. Sources of the first and fourth FETs are configured to receive a first input signal of an input differential signal pair. The gates of the first, second, fourth, and fifth FETs are configured to receive a second input signal of the input differential signal pair. A drain of the third FET is coupled to a drain of the sixth FET.

In some embodiments, the first type of FET is a p-type FET and the second type of FET is an n-type FET. In some embodiments, the first power supply rail is configured to provide a ground potential, and the second power supply rail is configured to provide a supply voltage potential greater than the ground potential.

In some embodiments, the first type of FET is an n-type FET and the second type of FET is a p-type FET. In some embodiments, the second power supply rail is configured to provide a ground potential, and the first power supply rail is configured to provide a supply voltage potential greater than the ground potential.

In some embodiments, the signal repeater circuit further includes an output terminal coupled to the drains of the third and sixth FETs, and the signal repeater circuit is configured to set a level of an output signal at the output terminal to represent an inverse of a value represented by the first input signal in response to a transition of the first input signal and a complementary transition of the second input signal. In some embodiments, the signal repeater circuit is a first signal repeater circuit, and the system further includes a second signal repeater circuit. In some embodiments, the second signal repeater circuit includes: a seventh FET of the second type and eighth and ninth FETs of the first type, wherein a gate of the seventh FET is coupled to a gate of the eighth FET, a drain of the seventh FET is coupled to a drain of the eighth FET and to a gate of the ninth FET, and sources of the eighth and ninth FETs are coupled to the second power supply rail. In some embodiments, the second signal repeater circuit further includes a tenth FET of the first type and eleventh and twelfth FETs of the second type, wherein a gate of the tenth FET is coupled to a gate of the eleventh FET, a drain of the tenth FET is coupled to a drain of the eleventh FET and to a gate of the twelfth FET, and sources of the eleventh and twelfth FETs are coupled to the first power supply rail, wherein sources of the seventh and tenth FETs are configured to receive the second input signal of the input differential signal pair, wherein the gates of the seventh, eighth, tenth, and eleventh FETs are configured to receive the first input signal of the input differential signal pair, and wherein a source of the ninth FET is coupled to a source of the twelfth FET.

In some embodiments, the output signal is a first output signal, the output terminal is a first output terminal, the second signal repeater circuit further includes a second output terminal coupled to the sources of the ninth and twelfth FETs, and the second signal repeater circuit is configured to set a level of a second output signal at the second output terminal to represent an inverse of a value represented by the second input signal in response to a transition of the second input signal and a complementary transition of the first input signal.

In some embodiments, the system further includes an equalization circuit coupled to the output terminals of the first and second signal repeater circuits. In some embodiments, the first and second output signals form an output differential signal pair, and the equalization circuit counteracts skewing of the output differential signal pair. In some embodiments, the levels of the output signals are voltage levels, and the equalization circuit is configured to at least partially equalize the voltage levels of the first and second output signals in response to a transition of the first input signal and prior to a complementary transition of the second input signal, and/or in response to a transition of the second input signal and prior to a complementary transition of the first input signal. In some embodiments, the levels of the output signals are voltage levels, and the equalization circuit is configured to at least partially equalize the voltage levels of the first and second output signals based on a determination that the first and second input signals do not represent complementary values. In some embodiments, the levels of the output signals are voltage levels, and the equalization circuit is configured to at least partially equalize the voltage levels of the first and second output signals during a period when the first and second input signals do not represent complementary values.

In some embodiments, the equalization circuit includes a switch having a first terminal coupled to the first output terminal of the first signal repeater circuit and a second terminal coupled to the second output terminal of the second signal repeater circuit. In some embodiments, the equalization circuit further includes a driver circuit configured to control operation of the switch. In some embodiments, the driver circuit is configured to activate the switch in response to transitions of the first and second input signals and prior to the signal repeater circuits changing the levels of the first and second output signals in response to the transitions of the first and second input signals. In some embodiments, the driver circuit is configured to activate the switch in response to a transition of the first input signal and prior to a complementary transition of the second input signal, and/or in response to a transition of the second input signal and prior to a complementary transition of the first input signal.

In some embodiments, the driver circuit includes: thirteenth and fourteenth FETs of the first type, wherein a gate of the thirteenth FET is coupled to the second output terminal of the second signal repeater circuit, wherein a source of the thirteenth FET is configured to receive the second input signal, wherein a gate of the fourteenth FET is coupled to the first output terminal of the first signal repeater circuit, and wherein a source of the fourteenth FET is configured to receive the first input signal; and fifteenth and sixteenth FETs of the second type, wherein a gate of the fifteenth FET is configured to receive the second input signal, wherein a source of the fifteenth FET is coupled to the first output terminal of the first signal repeater circuit, wherein a gate of the sixteenth FET is configured to receive the first input signal, and wherein a source of the sixteenth FET is coupled to the second output terminal of the second signal repeater circuit, wherein drain terminals of the thirteen, fourteenth, fifteenth, and sixteenth FETs are coupled together and coupled to a control terminal of the switch.

In some embodiments, the equalization circuit includes a switch having a first terminal coupled to the first input terminal of the first signal repeater circuit and a second terminal coupled to the second input terminal of the first signal repeater circuit.

According to another aspect of the present disclosure, a system is provided. The system includes first and second input terminals configured to receive, respectively, first and second input signals of an input differential signal pair, and means for providing, at an output terminal, an output signal having a level representing an inverse of a value represented by the first input signal in response to a transition of the first input signal and a complementary transition of the second input signal.

In some embodiments, the output terminal is a first output terminal. The output signal is a first output signal. The system further includes means for providing, at a second output terminal, a second output signal having a level representing an inverse of a value represented by the second input signal in response to the transition of the first input signal and the complementary transition of the second input signal.

In some embodiments, the system further includes means for at least partially equalizing voltage levels of the first and second output signals based on a determination that the first and second input signals do not represent complementary values.

Other aspects and advantages of the invention will become apparent from the following drawings, detailed description, and claims, all of which illustrate the principles of the invention, by way of example only.

BRIEF DESCRIPTION OF THE DRAWINGS

Certain advantages of some embodiments of the present disclosure may be understood by referring to the following description taken in conjunction with the accompanying drawings. In the drawings, similar reference characters generally refer to the same parts throughout the different views. Also, the drawings are not necessarily to scale, emphasis instead generally being placed upon illustrating principles of some embodiments of the invention.

DETAILED DESCRIPTION

Figure 1:
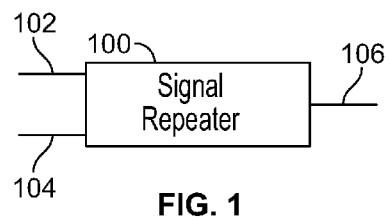
FIG. 1 is a block diagram of a signal repeater, in accordance with some embodiments.

FIG. 1 a block diagram of a signal repeater 100. The signal repeater 100 includes a first input terminal 102 and a second input terminal 104. The signal repeater 100 also includes an output terminal 106. A pair of input differential signals can be provided at the first terminal 102 and the second terminal 104. The signal repeater 100 operates to provide an output signal at the output terminal 106 based on the input signals at the input terminals 102 and 104. More particularly, the signal repeater 100 can operate to provide an output signal at the output terminal 106 that represents the logical inverse (complement) of the first input signal, or to place the output terminal 106 in a high-impedance state, depending on the values of the input signals.

In some embodiments, when the signal repeater 100 determines that the first and second input signals represent complementary logical values, the signal repeater 100 provides an output signal that represents the logical inverse of the first input signal. In some embodiments, when the signal repeater determines that the first and second input signals represent non-complementary logical values (e.g., the same logical value), the signal repeater 100 places the output terminal 106 in a high-impedance state.

One of ordinary skill in the art will understand that a circuit's output terminal is in a high-impedance state (or "tri-state") when the circuit is not actively driving a current onto the output terminal or actively driving the potential of the output terminal. For example, a circuit's output terminal is in a high-impedance state when the circuit provides no conductive path between the output terminal and the circuit's reference (ground) voltage or power-supply voltage. Thus, when a circuit's output terminal is in a high-impedance state, any charge on the output terminal will generally not discharge to ground through the circuit, and the circuit will generally not deposit additional charge on the output terminal. One of ordinary skill in the art will understand that when the circuit's output terminal is in the high-impedance state, the output terminal can be charged or discharged through leakage currents in the circuit, through another circuit coupled to the output terminal, through interaction with an electromagnetic field, etc. Thus, from the circuit's perspective, the value of the output terminal can generally be undetermined when the output terminal is in the high-impedance state. However, in some embodiments, when the circuit's output terminal is initially placed in the high-impedance state, the output terminal can initially retain the same value (e.g., potential) that was on the output terminal just prior to the output terminal being placed in the high-impedance state.

In some embodiments, the signal repeater 100 provides an output signal at the output terminal 106 in response to a transition of one of the input signals to a complementary logical value of the other input signal. More particularly, after determining that one input signal has transitioned to a complementary logical value of the other input signal, the signal repeater 100 can provide an output signal that represents the inverse of the logical value of one of the input signals. In some embodiments, the signal repeater 100 provides an output signal that is the inverse of the first input signal in response to a logical transition of the first input signal (e.g., from logic "0" to logic "1", or vice versa) and a complementary logical transition of the second input signal.

One of ordinary skill in the art will appreciate that the input signals represent complementary values when one of the input signals represents a logical value of "1" ("L1") while the other input signal represents a logical value of "0" ("L0"). The input signals do not represent complementary values when both of the input signals represent the same logic value (e.g., both signals represent L0, or both signals represent L1), or when the value represented by at least one of the input signals cannot be reliably determined. Here, L1 can correspond to a power-supply voltage value (e.g., 1.2 Volts) of the signal repeater 100 (or of an IC including the signal repeater 100), and L0 can correspond to a reference or ground plane (e.g., 0 Volts) of the signal repeater 100 (or of an IC including the signal repeater 100). Other voltage values for L1 and L0 are possible. For example, L1 can correspond to any voltage above a first threshold voltage (e.g., any voltage above a voltage that is 80% of the actual or nominal power-supply voltage), L0 can correspond to any voltage below a second threshold voltage (e.g., any voltage below a voltage that is 20% of the difference between (1) the actual power-supply voltage and the actual reference voltage, or (2) the nominal power-supply voltage and the nominal reference voltage), and the logical value of a signal can be indeterminate if the voltage of the signal is between the first and second thresholds.

Here, for purposes of illustration, assume that a first input signal is provided to the input terminal 102 and a second input signal is provided to the input terminal 104. Assume that at a time t0, the first input signal represents L1 while the second input signal represents L0. Also assume that at the time t0, the signal repeater 100 is providing an output signal at the output terminal 106 representing L0, that is, the inverse of the first input signal.

At a time t1 after the time t0, the second input signal transitions from L0 to L1. Because the first and second input signals do not have complementary values (in this example, both signals represent L1), the signal repeater 100 can place the output terminal 106 in a high-impedance state.

At a time t2 after the time t1, the first input signal transitions from L1 to L0. In response to determining that the first and second input signals have complementary values (the first input signal at L0 and the second input signal at L1), the signal repeater 100 can place the output terminal 106 at L1 (the inverse of the first input signal) (e.g., at a time t3 after the time t2).

In this way, when the first and second input signals correspond to a pair of switching complementary signals, the signal repeater 100 can, in some embodiments, switch the output signal (from L0 to L1, or vice versa) only after both input signals switch, for example, after the first input signal transitions from L0 to L1 and the second input signal transitions from L1 to L0, or after the first input signal transitions from L1 to L0 and the second input signal transitions from L0 to L1.

For instance, the first and second input signals can correspond to a pair of differential clock signals CLKP and CLKN. The output signal can correspond to a differential clock signal CLKPQ, which can be an inverse of the input clock signal CLKP. In some embodiments, the signal repeater 100 switches the output clock signal CLKPQ only after both input clock signals CLKP and CLKN switch. If only one of the CLKP and CLKN clock signals switches, such that both signals have the same logic value, the signal repeater 100 can place the output terminal 106 in a high-impedance state.

It is thus not required for both clock signals CLKP and CLKN to switch at the same time (or within a particular time window) for the signal repeater 100 to switch the output clock signal CLKPQ. Since it is not required for both clock signals CLKP and CLKN to switch at the same time (or within a particular time window), the signal repeater 100 can tolerate variations (e.g., manufacturing process variations) that may cause either of the input clock signals to switch at a later time than its differential counterpart.

Figure 2A:
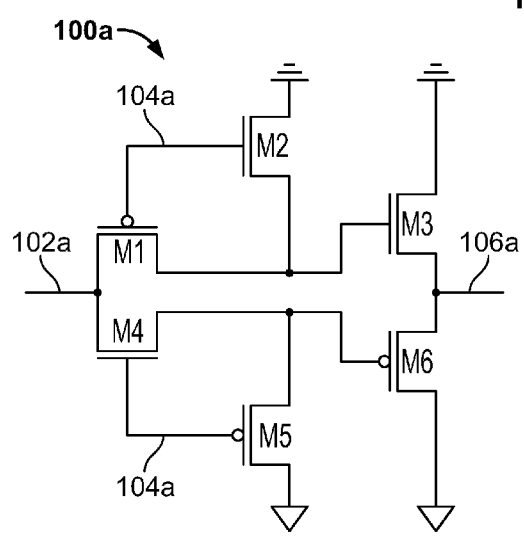
FIG. 2A is a schematic of a signal repeater, in accordance with some embodiments.

FIG. 2A shows a schematic of a signal repeater 100a, according to some embodiments. The signal repeater 100a is an example of an implementation of the signal repeater 100. The signal repeater 100a includes a first input terminal 102a, a second input terminal 104a, and an output terminal 106a. The signal repeater 100a includes a p-type field effect transistor (FET) M1, n-type FET (NFET) M2, n-type FET M3, n-type FET M4, p-type FET (PFET) M5, and p-type FET M6. Here, each FET has a gate terminal ("gate"), a source terminal ("source") and a drain terminal ("drain"). Source and drain terminals are diffusion terminals corresponding to respective diffusion regions adjacent to the gate structure in the FET. The terms "drain" and "source" are used interchangeably herein and generally describe directions of movement of charge carriers (e.g., electrons or holes) between the two diffusion regions under different voltage bias conditions.

As shown in FIG. 2A, drains of M1 and M2 are coupled to a gate of M3. Drains of M4 and M5 are coupled to a gate of M6. Gates of M1, M2, M4, and M5 are coupled together to receive an input signal at the input terminal 104a. Sources of M1 and M4 are coupled together to receive another input signal at the input terminal 102a. Drains of M3 and M6 are coupled together to provide an output signal at the output terminal 106a. Sources of M2 and M3 are coupled to a reference (ground) voltage. Sources of M5 and M6 are coupled to a power supply voltage.

In FIG. 2A, input signals at the input terminals 102a and 104a can be a pair of differential signals. For instance, the input signals can be a pair of differential clock signals CLKP at the input terminal 102a and CLKN at the input terminal 104a.

The clock signals CLKP and CLKN can have complementary values. For instance, when the value of CLKP represents L0 (e.g., CLKP is at the ground voltage), the value of CLKN can represent L1 (e.g., CLKN can be at the power-supply voltage). In this case, M2 and M4 are conducting. M1 and M5 are not conducting. The gates of M3 and M6 are at the ground voltage, because the gate of M3 is pulled down to ground by M2, and the gate of M6 is coupled to CLKP through M4. Thus M3 is not conducting and M6 is conducting. The output terminal 106a is therefore pulled up to the supply voltage by M6, that is, an output clock signal CLKPQ at the output terminal 106a is pulled up to the power-supply voltage representing L1, which is the inverse of the logical value of the input clock signal CLKP.

As for another example, when CLKP represents L1 (e.g., CLKP is at the power supply voltage), CLKN can represent L0 (e.g., CLKN can be at the ground voltage). In this case, M1 and M5 are conducting. M2 and M4 are not conducting. The gates of M3 and M6 are at the power supply voltage, because the gate of M3 is coupled to CLKP through M1, and the gate of M6 is pulled up to the power supply voltage by M5. Thus M3 is conducting and M6 is not conducting. The output terminal 106a is therefore pulled down to the ground voltage, that is, the output clock signal CLKPQ at the output terminal 106a represents L0, which is the inverse of the value of the input clock signal CLKP.

When one of the input clock signals transitions to a value such that the two input clock signals are no longer complementary, the signal repeater 100a can place the output terminal 106a in a high-impedance state. In some embodiments, the signal repeater 100a switches CLKPQ to the inverse of its previous logical value only after both CLKP and CLKN switch and remain complementary.

For example, assume that at a time instance t0, the input signals CLKP and CLKN represent complementary logical values L0 and L1, respectively. After time t0, CLKP and CLKN may become non-complementary, for example, CLKP may transition from a value representing L0 to a value representing L1 while CLKN is held at a value representing L1. As described earlier, the gates of M3 and M6 are at the ground voltage before CLKP transitions from L0 to L1. As CLKP transitions from a value representing L0 to a value representing L1, M4 becomes non-conducting (when M4's gate-source voltage drops below M4's threshold voltage). Since M5 is still not conducting, the gate of M6 is pulled up to a value approximately equal to the value of CLKP (e.g., the power-supply voltage) minus the threshold voltage of M4, and then the gate of M6 becomes floating when M4 becomes non-conducting. In this case, M6 becomes non-conducting, CLKPQ is still at logical value L1, and the output terminal 106a is in a high-impedance state. CLKPQ will transition to the inverse value (L0) of CLKP (L1) again after CLKN transitions from L1 to L0, thereby becoming complementary to CLKP (L1), as gates of both M3 and M6 settle to the power supply voltage, as described earlier.

Similarly, CLKP and CLKN may become non-complementary after time t0, for example, when CLKP is held at a value representing L0 while CLKN transitions from a value representing L1 to a value representing L0. In this case, M2 becomes non-conducting (because the NFET's gate-source voltage drops to approximately 0 Volts, which is below the NFET's threshold voltage) and M1 remains non-conducting (because the PFET's gate-source voltage drops to approximately 0 Volts, which is above the PFET's threshold voltage). Thus, the gate of M3 becomes floating, with an initial value approximately equal to the ground voltage, and M3 remains non-conducting. In addition, M4 becomes non-conducting and M5 becomes conducting. Thus, the gate of M6 is pulled up by M5 to the power-supply voltage, and M6 becomes non-conducting. In this case. CLKPQ is still at a value representing L1, and the output terminal 106a is in a high-impedance state. After CLKP transitions from L0 to L1, thereby becoming complementary to CLKN (L0) again, the signal repeater 100a can transition CLKPQ to the inverse value (L0) of CLKP (L1), as the gates of both M3 and M6 settle to the power-supply voltage, as described earlier.

As another example, assume that at a time t1, CLKP and CLKN represent complementary values L1 and L0, respectively. After time t1, CLKP and CLKN may become non-complementary, for example, CLKP may transition from a value representing L1 to a value representing L0 while CLKN is held at a value representing L0. As described above, the gates of transistors M3 and M6 are at L1 just prior to CLKP transitioning to L0. As CLKP transitions from L1 to L0, M6 remains non-conducting because M5 continues to pull the gate of M6 up to the power-supply voltage. Since M2 is still not conducting, the potential at the gate of M3 is pulled down to a value approximately equal to the value of CLKP (e.g., the ground voltage) minus the gate-source voltage of M1, and then the gate of M3 becomes floating when M1 becomes non-conducting. In this case, M3 is non-conducting, CLKPQ is still at logical value L0, and the output terminal 106a is in a high-impedance state. After CLKN transitions from L0 to L1, CLKPQ will transition to L1, thereby becoming complementary to CLKP (L0), as gates of both M3 and M6 settle to the ground voltage.

Similarly, CLKP and CLKN may become non-complementary after the particular time instance, for example, when CLKP is held at a value representing L1 while CLKN transitions from L0 to L1. As described above, the gates of transistors M3 and M6 are at L1 just prior to CLKN transitioning to L1. As CLKN transitions from L0 to L1, M3 becomes non-conducting because M2 pulls the gate of M3 down to the ground voltage. In addition, M5 becomes non-conducting and M4 remains non-conducting. Thus, the gate of M6 becomes floating with the initial value of approximately L1, and M6 remains non-conducting. In this case, M3 and M6 are non-conducting, CLKPQ is still at L0, and the output terminal 106a is in a high-impedance state. After CLKP transitions from L1 to L0, thereby becoming complementary to CLKN (L1) again, the signal repeater 100a can transition CLKPQ to the inverse value (L1) of CLKP (L0), as the gates of both M3 and M6 settle to the ground voltage.

In each of the above-described examples, when the input signals represent non-complementary values (e.g., after one input signal transitions to the logical value of the other input signal, and before the other input signal makes a complementary transition), the signal repeater 100a places the output terminal 106a in a high-impedance state, with the initial value of the output signal at the high-impedance output terminal approximately equal to the previous value of the output signal (e.g., the value of the output signal just prior to the input signals becoming non-complementary, when the input signals most recently represented complementary values).

Figure 2B:
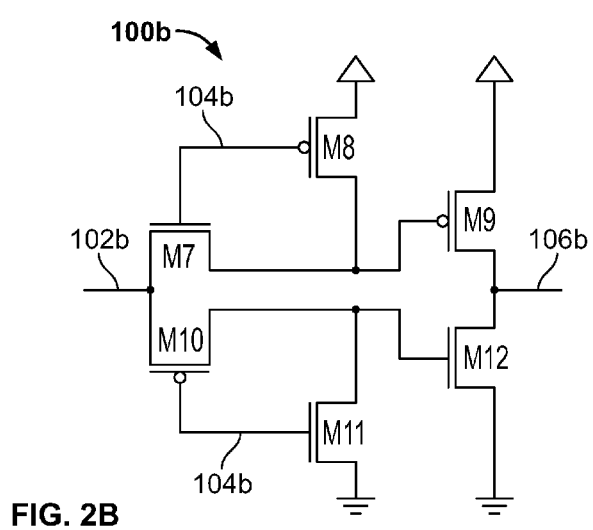
FIG. 2B is a schematic of another signal repeater, in accordance with some embodiments.

FIG. 2B shows a schematic of another signal repeater 100b, according to some embodiments. The signal repeater 100b is another example of an implementation of the signal repeater 100. The signal repeater 100b includes a first input terminal 102b, a second input terminal 104b, and an output terminal 106b. The signal repeater 100b includes a n-type FET M7, p-type FET M8, p-type FET M9, p-type FET M10, n-type FET M11, and n-type FET M12.

As shown in FIG. 2B, drains of M7 and M8 are coupled to a gate of M9. Drains of M10 and M11 are coupled to a gate of M12. Gates of M7, M8, M10, and M11 are coupled together to receive an input signal at the input terminal 104b. Sources of M7 and M10 are coupled together to receive another input signal at the input terminal 102b. Drains of M9 and M12 are coupled together to provide an output signal at the output terminal 106a. Sources of M8 and M9 are coupled to a power-supply voltage. Sources of M11 and M12 are coupled to a reference (ground) voltage.

The structure of the signal repeater 100b is complementary to the structure of the signal repeater 100a. For instance, M1, M5, and M6 are p-type FETs in the signal repeater 100a. In comparison, M7, M11, and M12 are n-type FETs in the signal repeater 100b. As for another example, M4, M2, and M3 are n-type FETs in the signal repeater 100a. In comparison, M10, M8, and M9 are p-type FETs in the signal repeater 100b.

Similar to the operations of the signal repeater 100a described in reference to FIG. 2A, the signal repeater 100b provides an output clock signal CLKNQ at the output terminal 106b that represents the inverse of the value represented by an input clock signal CLKN at the input terminal 102b, when the logical value of CLKN is complementary to the logical value of another clock signal CLKP at the input terminal 104b. For instance, the signal repeater 100b sets CLKNQ to L1 when CLKN is L0 and CLKP is L1, and sets CLKNQ to L0 when CLKN is L1 and CLKP is L0. When CLKN and CLKP are not complementary, for instance, when both CLKN and CLKP have the same logical value (L0 or L1), the signal repeater 100b places the output terminal 106b in a high-impedance state. In some embodiments, when the input signals represent non-complementary values, the signal repeater 100b places the output terminal 106b in a high-impedance state, with the initial value of the output signal at the high-impedance output terminal being approximately equal to the previous value of the output signal (e.g., the value of the output signal just prior to the input signals becoming non-complementary, when the input signals most recently represented complementary values). In some embodiments, the signal repeater 100b switches CLKNQ only after both CLKP and CLKN switch and remain complementary.

Figure 3:
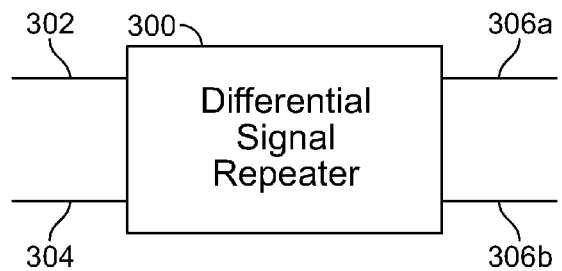
FIG. 3 is a block diagram of a differential signal repeater, in accordance with some embodiments.

FIG. 3 shows a block diagram of a differential signal repeater 300, according to some embodiments. The differential signal repeater 300 includes a first input terminal 302, a second input terminal 304, a first output terminal 306a, and a second output terminal 306b. The differential signal repeater 300 operates to provide output signals at the output terminals 306a and 306b based on the input signals at the input terminals 302 and 304. More particularly, when the input signals at the input terminals 302 and 304 are a pair of input differential signals with complementary values, the differential signal repeater 300 operates to provide, at the output terminals 306a and 306b, a pair of output differential signals with complementary values. When the input signals represent non-complementary values, the differential signal repeater 300 places the output terminals 306a and 306b in a high-impedance state.

In some embodiments, differential signal repeater 300 provides a differential pair of output signals at output terminals 306a and 306b that represent the inverse of the input differential signals at the input terminals 302 and 304, respectively. The differential signal repeater 300 may provide the differential pair of output signals based on a determination that the input differential signals have complementary values (e.g., in response to detecting that the input differential signals have complementary values). For instance, the input signals can correspond to a pair of differential clock signals CLKP (at the input terminal 302) and CLKN (at the input terminal 304). The output signals can correspond to a pair of output differential clock signals CLKPQ (at the output terminal 306a) and CLKNQ (at the output terminal 306b). When CLKP and CLKN have complementary values, the differential signal repeater 300 can provide (1) at output terminal 306a, an output signal CLKPQ with a logical value that is the inverse of the logical value of input signal CLKP, and (2) at output terminal 306b, an output signal CLKNQ with a logical value that is the inverse of the input signal CLKN. For example, if CLKP and CLKN have values representing L0 and L1, respectively (or L1 and L0, respectively), the differential signal repeater 300 can set the output signals CLKPQ and CLKNQ to values representing L1 and L0, respectively (or L0 and L1, respectively).

If the input signals CLKP and CLKN do not represent a pair of complementary values (e.g., when the input signals both represent L0 or both represent L1), the differential signal repeater 300 can place the output terminals 306a and 306b in a high-impedance state. In some embodiments, when the differential signal repeater 300 places the output terminals 306a and 306b in the high-impedance state, the initial value of the signal at each high-impedance output terminal is approximately equal to the previous value of that output signal (e.g., the value of the output signal just prior to the input signals becoming non-complementary, when the input signals most recently represented complementary values). In some embodiments, the signal repeater 300 switches CLKPQ and CLKNQ only after both CLKP and CLKN switch and remain complementary.

Here, for purposes of illustration, assume that at a time t0, the value of input signal CLKP represents L0 and the value of input signal CLKN represents L1. Since CLKP and CLKN have complementary values, the differential signal repeater 300 sets the output signals CLKPQ and CLKNQ to complementary values (e.g., values representing L1 and L0, respectively). At a time t1 after the time t0, CLKP transitions to a value representing L1, while CLKN remains at L1. Because input signals CLKP and CLKN do not represent complementary logical values, the differential signal repeater 300 places the output terminals 306a and 306b in a high-impedance state. At a time t2 after the time t1, CLKN transitions to a value representing L0, while CLKP remains at a value representing L1. After determining that the input signals CLKP and CLKN have complementary values, the differential signal repeater 300 can set CLKPQ to a value representing L0 and CLKNQ to a value representing L1 (e.g., at a time t3 after the time t2).

In this way, the differential signal repeater 300 can switch the output differential signals CLKPQ and CLKNQ only after both input differential signals CLKP and CLKN switch. Since it is not required for both input differential signals CLKP and CLKN to switch at the same time (or within a specified time window), the differential signal repeater 300 can tolerate variations (e.g., manufacturing process variations) that may cause either of the input differential signals to switch at a later time than its complementary counterpart, or outside a specified time window relative to the switching of its counterpart. Even when one of the input differential signals switches later than the other input differential signal (e.g., outside a specified time window relative to the switching of the other input differential signal), the differential signal repeater 300 can switch the output differential signals at the same time or approximately the same time (e.g., within a specified time window of each other). Thus, the output differential signals of the differential signal repeater 300 can be less skewed than the signal repeater's input differential signals, because the time period between complementary transitions of the differential signal repeater's output differential signals can be shorter than the time period between complementary transitions of the differential signal repeater's input differential signals. Alternatively or in addition, in a circuit in which a differential signal S propagates from a first pair of nodes NA to a second pair of nodes NB, the skewing of the differential signal S can be reduced if the signal propagates from nodes NA to nodes NB through a differential signal repeater, rather than simply propagating along a pair of wires. In other words, the differential signal repeater can, in some embodiments, reduce the skewing of a differential signal S relative to the amount of skewing that would be present in the absence of the differential signal repeater.

In some embodiments, a set of differential signal repeaters 300 can be used to propagate differential clock signals throughout an integrated circuit or a region thereof, or to multiple components of an integrated circuit. In some embodiments, the differential signal repeaters 300 can de-skew the differential clock signals (e.g., prevent, counteract, or correct skewing of the differential clock signals).

In some embodiments, the delay of the differential signal repeater 300 (e.g., the maximum delay from an input terminal 302/304 to an output terminal 306) is less than 100 ps (e.g., between approximately 50 ps and approximately 100 ps).

Figure 4A:
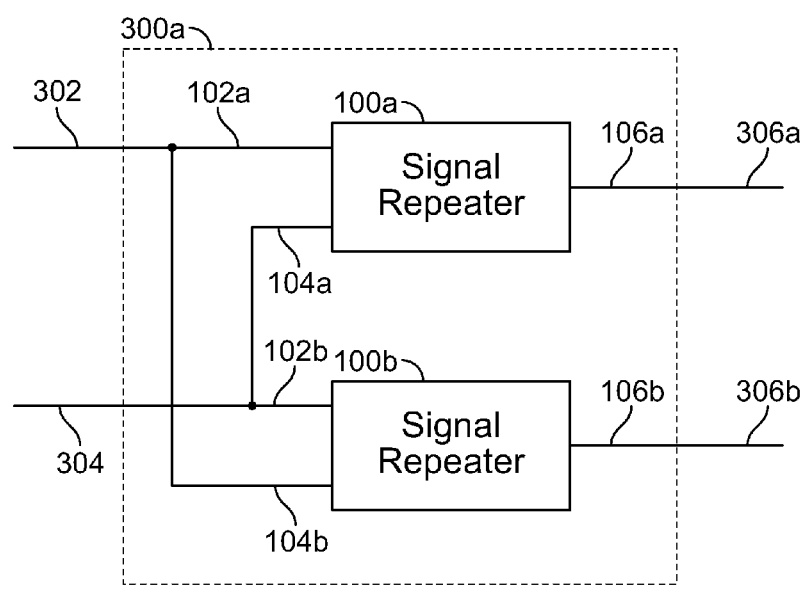
FIG. 4A is a schematic of a differential signal repeater, in accordance with some embodiments.

FIG. 4A is a schematic of a differential signal repeater 300a, according to some embodiments. The differential signal repeater 300a is an example of an implementation of the differential signal repeater 300. The differential signal repeater 300a includes two signal repeaters 100-1 and 100-2. In the example of FIG. 4A, the signal repeater 100-1 is implemented as a signal repeater 100a, and the signal repeater 100-2 is implemented as a signal repeater 100b. In some embodiments, both signal repeaters 100-1 and 100-2 are implemented as signal repeaters 100a. In some embodiments, both signal repeaters 100-1 and 100-2 are implemented as signal repeaters 100b. The integrated circuit layout of the differential signal repeater 300a may be more compact when two signal repeaters 100 of different types (e.g., a signal repeater 100a and a signal repeater 100b) are used, and less compact when signal repeaters 100 of the same type (e.g., two signal repeaters 100a or two signal repeaters 100b) are used.

In the example of FIG. 4A, the input terminal 302 of the differential signal repeater is coupled to the first input terminal (102a) of the signal repeater 100-1 and the second input terminal (104b) of the signal repeater 100-2. The input terminal 304 of the differential signal repeater is coupled to the second input terminal (104a) of the signal repeater 100-1 and the first input terminal (102b) of the signal repeater 100-2. The output terminal 306a of the differential signal repeater is coupled to the output terminal (106a) of the signal repeater 100-1. The output terminal 306b of the differential signal repeater is coupled to the output terminal (106b) of the signal repeater 100-2.

Thus, as described above with reference to FIGS. 1, 2A, and 2B, the signal repeater 100-1 provides the output signal at the output terminal 306a based on the input signals applied to the input terminals 302 and 304, with the input signal at the differential signal repeater's input terminal 302 being applied to the first input terminal 102 of the signal repeater 100-1, and the input signal at the differential signal repeater's input terminal 304 being applied to the second input terminal 104 of the signal repeater 100-1. Likewise, the signal repeater 100-2 provides the output signal at the output terminal 306b based on the input signals applied to the input terminals 302 and 304, with the input signal at the differential signal repeater's input terminal 304 being applied to the first input terminal 102 of the signal repeater 100-2, and the input signal at the differential signal repeater's input terminal 302 being applied to the second input terminal 104b of the signal repeater 100-2.

In some embodiments, a pair of input differential clock signals, CLKP and CLKN, may be provided at the input terminals 302 and 304 of the differential signal repeater 300a, respectively. The differential signal repeater 300a may provide a pair of output differential clock signals, CLKPQ and CLKNQ, at its output terminals 306a and 306b, respectively.

Figure 4B:
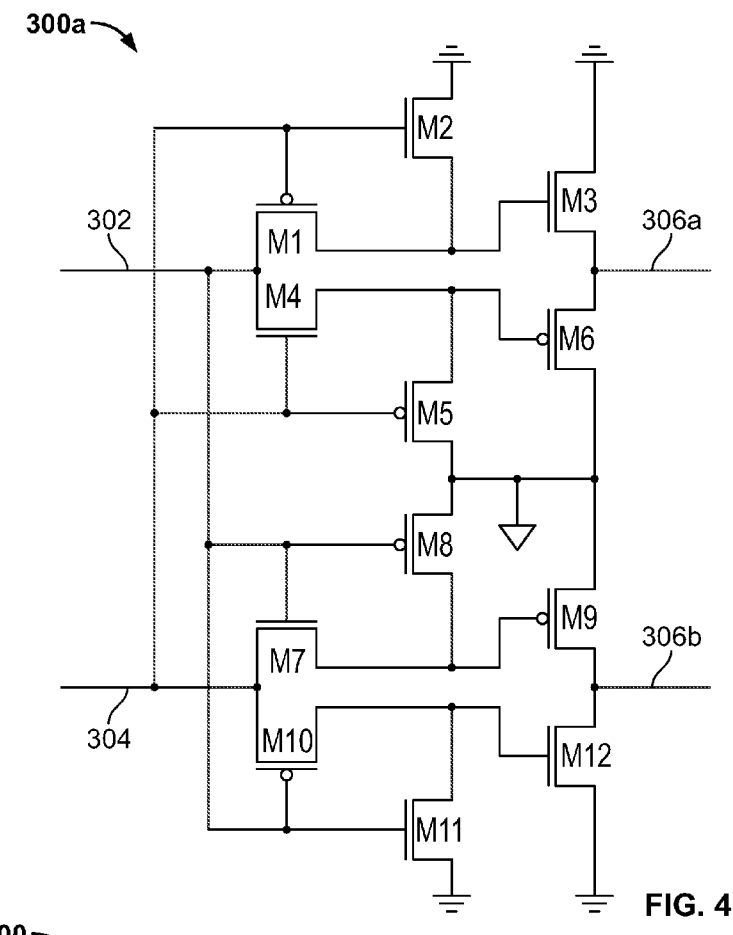
FIG. 4B is a schematic of another differential signal repeater, in accordance with some embodiments.

FIG. 4B is another schematic of the signal repeater 300a, according to some embodiments. More particularly, FIG. 4B shows a schematic of the signal repeater 300a in which the signal repeater 100-1 is implemented using the schematic of the signal repeater 100a, and the signal repeater 100-2 is implemented using the schematic of the signal repeater 100b. Here, the input terminal 302 (e.g., input signal CLKP) is coupled to the sources of M1 and M4 of the signal repeater 100a, and to the gates of M7, M8, M10, and M1l of the signal repeater 100b. The input terminal 304 (e.g., input signal CLKN) is coupled to the gates of M1, M2, M4, and M5 of the signal repeater 100a, and to the sources of M7 and M10 of the signal repeater 100b. The output terminal 306a (e.g., output signal CLKPQ) is coupled to drains of M3 and M6 of the signal repeater 100a. The output terminal 306b (e.g., output signal CLKNQ) is coupled to drains of M9 and M12 of the signal repeater 100b.

Figure 5:
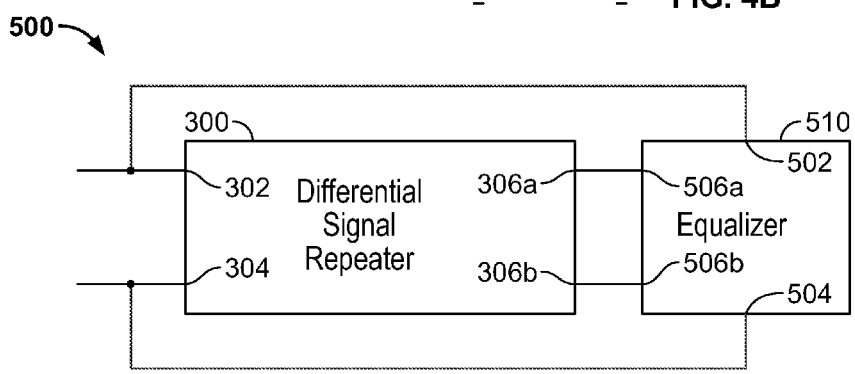
FIG. 5 is a block diagram of an equalizing differential signal repeater, in accordance with some embodiments.

FIG. 5 is a block diagram of an equalizing differential signal repeater 500. The equalizing repeater 500 includes a differential signal repeater 300 and an equalizer 510. The input terminals 302 and 304 of the differential signal repeater 300 are coupled to the first and second input terminals 502 and 504 of the equalizer 510, respectively. The output terminals 306a and 306b of the differential signal repeater 300 are coupled to the first and second input/output terminals 506a and 506b of the equalizer 510, respectively.

In some embodiments, a pair of differential signals (e.g., differential clock signals CLKP and CLKN) are applied to the input terminals 302/502 and 304/504, respectively. In some embodiments, the differential signal repeater 300 provides a pair of differential signals (e.g., differential clock signals CLKPQ and CLKNQ) at the output terminals 306a and 306b, respectively, as described above with reference to FIG. 3. The equalizer 510 operates to equalize the two output signals (CLKPQ and CLKNQ) of the differential signal repeater 300, at least in part. In some embodiments, equalizing the output signals involves changing the voltage level of one or both output signals so that the voltage levels of the output signals are approximately equal (e.g., in cases where the input signals are severely skewed). In some embodiments, partially equalizing the output signals involves changing the voltage level of at least one output signal toward the voltage level of the other output signal. Other types of equalization are possible, including any operation that reduces the distortion of the differential signal repeater's output signals relative to the distortion of its input signals, or relative to the amount of distortion that would be present in the output signals in the absence of the equalizer 510. In some embodiments, the equalization performed by the equalizer 510 conserves power, pre-charges/pre-discharges the differential signal repeater's output terminals for an upcoming switching of the logical values of the output signals, and/or reduces the switching time and/or stage delay of the differential signal repeater 300.

In some embodiments, the equalizer 510 at least partially equalizes voltage levels of the differential signal repeater's output signals when the input signals (CLKP and CLKN) do not have complementary values (e.g., both represent L0 or both represent L1). For instance, at a time t0, the input signal CLKP has a value representing L0 and the input signal CLKN has a value representing L1 (complementary to CLKP). In this case, the output signal CLKPQ has a value representing L1 and the output signal CLKNQ has a value representing L0. At a time t1 after the time t0, CLKP transitions from L0 to L1, while CLKN remains at L1. As the input signals CLKP and CLKN do not have complementary values, the differential signal repeater 300 places the output terminals 306a and 306b in the high-impedance state. At a time t2 after the time t1, but before a time t3 when CLKN transitions from L1 to L0 while CLKP remains at L1, the equalizer 510 can at least partially equalize voltage levels of the output signals CLKPQ and CLKNQ. For example, the equalizer 510 can change the voltage level of CLKPQ from an first value (e.g., at or near the power-supply voltage) to a second value less than the first value, thereby partially equalizing the voltage level of CLKPQ toward the voltage level of CLKNQ (e.g., at or near the ground voltage). In some embodiments, the equalizer 510 performs the equalization by moving charges from the output terminal 306 at the higher potential to the output terminal 306 at the lower potential. Moving charge from one output terminal to the other output terminal, rather than discharging the charge from one output terminal to ground and charging the other output terminal from the power supply, can conserve power.

After the time t3 when CLKN transitions from L1 to L0 while CLKP remains at L1, the differential signal repeater 300 sets CLKPQ to L0 (at or near the ground voltage) and CLKNQ to L1 (at or near the power-supply voltage). Thus, the equalizer 510 can "pre-charge" the output terminal 306 that is likely to transition from L0 to L1, and "pre-discharge" that output terminal 306 that is likely to transition from L1 to L0 after the input signals transition to non-complementary values, and before the input signals transition back to complementary values. After pre-charge and pre-discharge, the output signals are at respective voltage levels that are closer to their next expected voltage levels. Thus, the pre-charge and pre-discharge can reduce time needed for the equalizing repeater 500 to switch CLKPQ and CLKNQ from a first pair of complementary values to the opposite pair of complementary values. The equalizer 510 thus can reduce propagation delay (stage delay) of the differential signals across the equalizing differential signal repeater 500.

In some embodiments, the equalizer 510 can at least partially equalize the differential signal repeater's output signals even in cases where the logical values of the input signals switch simultaneously or nearly simultaneously. Thus, the equalizer 510 may conserve power, facilitate pre-charging/pre-discharging of the output terminals 306, and/or reduce the propagation delay of the differential output signals, even if the input signals are perfectly differential or very nearly perfectly differential.

Figure 6A:
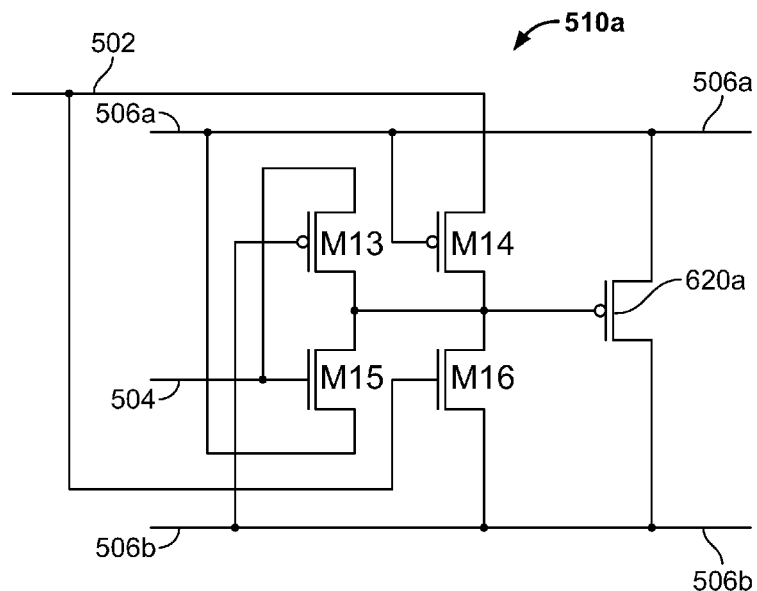
FIG. 6A is a schematic of an equalizing circuit, in accordance with some embodiments.

FIG. 6A is a schematic of an equalizing circuit 510a, according to some embodiments. The equalizing circuit 510a is an example of an implementation of the equalizer 510. The equalizing circuit 510a includes a switch 620a. The switch 620a can be a p-type FET. Other types of switches for the switch 620a are possible. For instance, the switch 620a can be a dual-type FET switch. The switch 620a has one terminal coupled to the input/output terminal 506a (and the output terminal 306a), and another terminal coupled to the input/output terminal 506b (and the output terminal 306b).

The equalizing circuit 510 also includes a driver circuit that is configured to control the switch 620a. In some embodiments, the driver circuit activates the switch 620a when either of the input signals (e.g., CLKP or CLKN) of the differential signal repeater 300 makes a logical transition, but before the other input signal (e.g., CLKP or CLKN) makes a corresponding transition to a complementary value of the first input signal. In some embodiments, the driver circuit activates the switch 620a at least for a short time period after the first and second input signals make complementary transitions.

In the example of FIG. 6A, the driver circuit includes a p-type FET M13, p-type FET M14, n-type FET M15, and n-type FET M16. M13 has its gate terminal coupled to the second output terminal 306b/506b of the differential signal repeater 300, one diffusion terminal coupled to the second input terminal 304/504 of the differential signal repeater 300, and the other diffusion terminal coupled to a gate of the switch 620a. M15 has its gate terminal coupled to the second input terminal 304/504 of the differential signal repeater 300, one diffusion terminal coupled to the gate of the switch 620a, and the other diffusion terminal coupled to the first output terminal 306a/506a of the differential signal repeater 300. M14 has its gate coupled to the first output terminal 306a/506a of the differential signal repeater 300, one diffusion terminal coupled to the first input terminal 302/502 of the differential signal repeater 300, and the other diffusion terminal coupled to the gate of the switch 620a. M16 has its gate coupled to the first input terminal 302/502 of the differential signal repeater 300, one diffusion terminal coupled to the gate of the switch 620a, and the other diffusion terminal coupled to the second output terminal 306b/506b of the differential signal repeater 300.

In some embodiments, when the input signals CLKP and CLKN at the input terminals 302 and 304 have complementary values, the output signal CLKPQ at the output terminals 306a has a value that represents the logical inverse of CLKP, and the output signal CLKNQ at the output terminal 306b has a value that represents the logical inverse of CLKN, the driver circuit turns off the switch 620a. Otherwise, the driver circuit facilitates equalization by placing the switch 620a in the conducting state.

An example of an implementation of the driver circuit is shown in FIG. 6A. Other embodiments of the driver circuit are possible. In some embodiments, the driver circuit includes one or more exclusive-OR ("XOR") gates configured to detect whether the input signals CLKP and CLKN have complementary values, and the driver circuit places the switch 620a in the conducting state when it detects that the input signals CLKP and CLKN do not have complementary values.

For instance, assume CLKP (at terminal 502) represents L1, CLKN (at terminal 504) represents L0, CLKPQ (at terminal 506a) represents L0 and CLKNQ at terminal 506b represents L1. M13, M15, and M16 are not conducting. M14 is conducting and therefore pulls up the gate of the switch 620a to L1 (CLKP). Thus the switch 620a is not conducting, and the equalizer 510 is not performing any equalization.

Continuing the example, when CLKP remains at L1 and CLKN transitions from L0 to L1, the differential repeater circuit places terminal 506a (CLKPQ) and terminal 506b (CLKNQ) in a high-impedance state. In this case, M13, M14, and M16 are not conducting. M15 is conducting, and pulls the gate of the switch 620a toward the voltage of CLKPQ, which is approximately the ground voltage. Thus, the switch 620a is turned on, enabling the voltage level of CLKNQ to change toward the voltage level of CLKPQ (and vice versa). In some cases (e.g., in cases where CLKN and CLKP are severely skewed), the switch 620a can remain turned on until the gate voltage of the switch 620a is close to the voltage level of the output signal CLKNQ (e.g., until the difference between the gate voltage of the switch 620a and the voltage level of CLKNQ is approximately equal to the threshold voltage of the switch 620a). Thus, in some cases, the switch 620a can remain turned on until the difference between the voltage levels of CLKPQ and CLKNQ is approximately equal to the threshold voltage of the switch 620a.

As another example, CLKP (at terminal 502) represents L0, CLKN (at terminal 504) represents L1, CLKPQ (at terminal 506a) represents L1 and CLKNQ (at terminal 506b) represents L0. M14, M15, and M16 are not conducting. M13 is conducting and pulls the gate of the switch 620a to the voltage level of CLKN (e.g., the power-supply voltage). Thus, the switch 620a is not conducting, and the equalizer 510 is not performing any equalization.

Continuing the example, when CLKN remains at L1 and CLKP transitions from L0 to L1, the differential repeater circuit places terminal 506a (CLKPQ) and terminal 506b (CLKNQ) in a high-impedance state. M13, M14, and M15 are not conducting. M16 is conducting, and pulls the gate of the switch 620a toward the voltage of CLKNQ, which is approximately the ground voltage. Thus, the switch 620a is turned on, enabling the voltage level of CLKPQ to change toward the voltage level of CLKNQ (and vice versa). In some cases, (e.g., in cases where CLKN and CLKP are severely skewed), the switch 620a can remain turned on until the gate voltage of the switch 620a is close to the voltage level of the output signal CLKPQ (e.g., until the difference between the gate voltage of the switch 620a and the voltage level of CLKPQ is approximately equal to the threshold voltage of the switch 620a). Thus, in some cases, the switch 620a can remain turned on until the difference between the voltage levels of CLKPQ and CLKNQ is approximately equal to the threshold voltage of the switch 620a.

As another example, CLKP (at terminal 502) represents L0, CLKN (at terminal 504) represents L1, CLKPQ (at terminal 506a) represents L1 and CLKNQ (at terminal 506b) represents L0. M14, M15, and M16 are not conducting. M13 is conducting and pulls the gate of the switch 620a to the voltage level of CLKN (e.g., the power-supply voltage). Thus, the switch 620a is not conducting, and the equalizer 510 is not performing any equalization. Continuing the example, CLKP and CLKN simultaneously (or nearly simultaneously) switch to L1 and L0, respectively. During the time period after CLKP and CLKN switch but before the differential signal repeater 300 begins to switch the output signals CLKPQ and CLKNQ, M13, M14, and M15 are not conducting, but M16 is conducting. Thus, M16 pulls down the gate of the switch 620a to the voltage of CLKNQ (e.g., approximately the ground voltage), thereby initiating the equalization of CLKPQ and CLKNQ.

Some embodiments have been described in which a signal repeater provides an output signal having a value that represents the inverse of the logical value of a first input signal, in response to determining that the first input signal and a second input signal represent complementary logical values. In some embodiments, the value of the signal repeater's output signal may be regarded as the repeated, non-inverted value of the signal repeater's second input signal, rather than the repeated, inverted value of the signal repeater's first input signal.

Likewise, some embodiments have been described in which a differential signal repeater provides output signals (e.g., CLKPQ and CLKNQ) that represent the inverses of corresponding input signals (e.g., CLKP and CLKN, respectively) in response to determining that the input signals represent complementary logical values. In some embodiments, the values of the differential signal repeater's output signals represent the non-inverted values of the corresponding input signals CLKP and CLKN, respectively. For example, referring to FIG. 4A, if the output terminal 106a of the first signal repeater 100-1 were coupled to the second output terminal 306b (rather than the first output terminal 306a) of the differential signal repeater 300, and the output terminal 106b of the second signal repeater 100-2 were coupled to the first input terminal 306a (rather than the second input terminal 306b) of the differential signal repeater 300, then output terminal 306a could be understood to provide the repeated, non-inverted value of CLKP, and the output terminal 306b could be understood to provide the repeated, non-inverted value of CLKN.

Figure 6B:
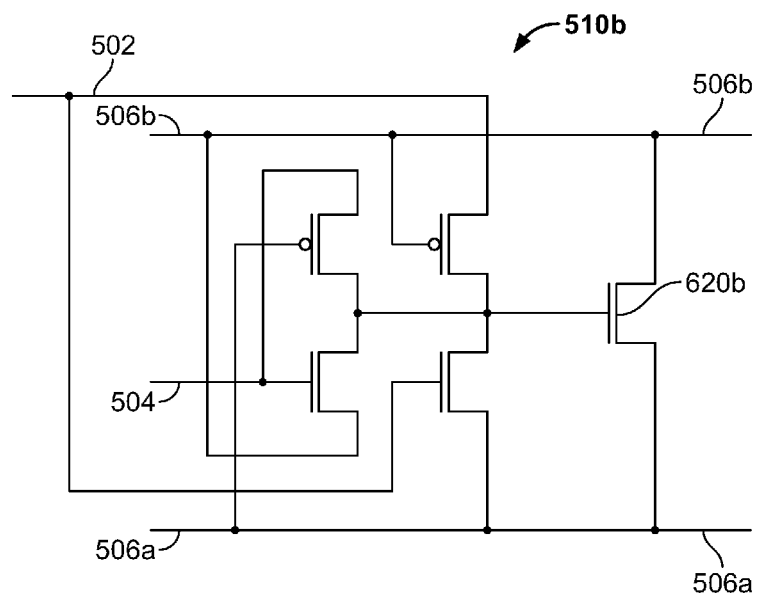
FIG. 6B is a schematic of another equalizing circuit, in accordance with some embodiments.

Some embodiments of an equalizer 510 have been described. FIG. 6B shows a schematic of an equalizing circuit 510b, according to some embodiments. The equalizing circuit 510b is an example of another implementation of the equalizer 510. In the example of FIG. 6B, the equalizing circuit 510b includes a switch 620b, which may be implemented using an NFET. In some embodiments, the equalizing circuit 510b is suitable for use as an equalizer 510 in connection with a non-inverting differential signal repeater 300. In some embodiments, the first input terminal 502 of the equalizing circuit 510b may be configured to receive the CLKP signal, the second input terminal 504 of the equalizing circuit 510b may be configured to receive the CLKN signal, the first input/output terminal 506a of the equalizing circuit 510b may be configured to receive the repeated, non-inverted value of the CLKN signal, and the second input/output terminal 506b of the equalizing circuit may be configured to receive the repeated, non-inverted value of the CLKP signal.

Some embodiments have been described in which the switch 620 of an equalizer 510 is coupled between the output terminals 306 of a differential signal repeater 300. In some embodiments, the switch 620 of an equalizer 510 may be coupled between the input terminals (302, 304) of a differential signal repeater 300.

Some embodiments have been described in which signal repeaters, differential signal repeaters, and/or equalizers are implemented using FETs. The components described as FETs herein may be implemented using any suitable type of transistor (e.g., MOSFET, FinFET, etc.) or any other suitable type of switch.

In some embodiments, two or more differential signal repeaters may be coupled together to form a differential clock distribution tree. The clock distribution tree's repeaters may be coupled together in any suitable topology including, but not limited to, a star topology, a ring topology, a linear topology, etc. When two differential signal repeaters are coupled together, the output terminals (306a, 306b) of a repeater may be coupled, respectively, to the input terminals (302, 304) of the other repeater. In some embodiments, a differential repeater may drive the inputs of two or more other differential repeaters.

In some embodiments, the differential signal repeater and/or differential clock distribution tree may be integrated into any suitable device including, without limitation, a microprocessor, liquid-crystal display (LCD) panel, light-emitting diode (LED) panel, television, mobile electronic device (e.g., laptop computer, tablet computer, smart phone, mobile phone, smart watch, etc.), computer (e.g., server computer, desktop computer, etc.) bitcoin mining device, etc.

Terminology

The phraseology and terminology used herein is for the purpose of description and should not be regarded as limiting.

The term "approximately", the phrase "approximately equal to", and other similar phrases, as used in the specification and the claims (e.g., "X has a value of approximately Y" or "X is approximately equal to Y"), should be understood to mean that one value (X) is within a predetermined range of another value (Y). The predetermined range may be plus or minus 20%, 10%, 5%, 3%, 1%, 0.1%, or less than 0.1%, unless otherwise indicated.

The indefinite articles "a" and "an," as used in the specification and in the claims, unless clearly indicated to the contrary, should be understood to mean "at least one." The phrase "and/or," as used in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

The use of "including," "comprising," "having," "containing," "involving," and variations thereof, is meant to encompass the items listed thereafter and additional items.

Use of ordinal terms such as "first," "second," "third," etc., in the claims to modify a claim element does not by itself connote any priority, precedence, or order of one claim element over another or the temporal order in which acts of a method are performed. Ordinal terms are used merely as labels to distinguish one claim element having a certain name from another element having a same name (but for use of the ordinal term), to distinguish the claim elements.

EQUIVALENTS

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A differential signal repeating method, comprising:
   receiving an input differential signal pair including first and second input signals received at first and second input terminals, respectively;
   generating first and second output signals at respective first and second output terminals, including:
      based on a determination, at a first time, that the first and second input signals represent complementary values, setting a level of the first output signal to represent an inverse of the value represented by the first input signal and setting a level of the second output signal to represent an inverse of the value represented by the second input signal, and
      based on a determination, at a second time, that the first and second input signals do not represent complementary values, placing the first output terminal in a high-impedance state and placing the second output terminal in a high-impedance state; and
   at least partially equalizing the levels of the first and second output signals, wherein the levels of the output signals are voltage levels.

2. The method of claim 1, wherein at least partially equalizing the voltage levels of the first and second output signals is performed based on a determination that the first and second input signals do not represent complementary values.

3. The method of claim 2, wherein the first and second output signals form an output differential signal pair.

4. The method of claim 3, wherein generating the output differential signal pair counteracts skewing of the output differential signal pair.

5. The method of claim 2, wherein at least partially equalizing the voltage levels of the first and second output signals comprises coupling the first output terminal to the second output terminal.

6. The method of claim 1, wherein at least partially equalizing the voltage levels of the first and second output signals counteracts skewing of the first and second output signals.

7. A system, comprising:
   a signal repeater circuit, including:
      a first field effect transistor (FET) of a first type and second and third FETs of a second type, wherein a gate of the first FET is coupled to a gate of the second FET, a drain of the first FET is coupled to a drain of the second FET and to a gate of the third FET, and sources of the second and third FETs are coupled to a first power supply rail;
      a fourth FET of the second type and fifth and sixth FETs of the first type, wherein a gate of the fourth FET is coupled to a gate of the fifth FET, a drain of the fourth FET is coupled to a drain of the fifth FET and to a gate of the sixth FET, and sources of the fifth and sixth FETs are coupled to a second power supply rail, wherein sources of the first and fourth FETs are configured to receive a first input signal of an input differential signal pair, wherein the gates of the first, second, fourth, and fifth FETs are configured to receive a second input signal of the input differential signal pair, and wherein a drain of the third FET is coupled to a drain of the sixth FET.

8. The system of claim 7, wherein the first type of FET is a p-type FET and the second type of FET is an n-type FET.

9. The system of claim 8, wherein the first power supply rail is configured to provide a ground potential, and wherein the second power supply rail is configured to provide a supply voltage potential greater than the ground potential.

10. The system of claim 7, wherein the first type of FET is an n-type FET and the second type of FET is a p-type FET.

11. The system of claim 10, wherein the second power supply rail is configured to provide a ground potential, and wherein the first power supply rail is configured to provide a supply voltage potential greater than the ground potential.

12. The system of claim 7, wherein the signal repeater circuit further comprises an output terminal coupled to the drains of the third and sixth FETs, and wherein the signal repeater circuit is configured to set a level of an output signal at the output terminal to represent an inverse of a value represented by the first input signal in response to a transition of the first input signal and a complementary transition of the second input signal.

13. The system of claim 12, wherein the signal repeater circuit is a first signal repeater circuit, and wherein the system further comprises a second signal repeater circuit.

14. The system of claim 13, wherein the second signal repeater circuit comprises:

a seventh FET of the second type and eighth and ninth FETs of the first type, wherein a gate of the seventh FET is coupled to a gate of the eighth FET, a drain of the seventh FET is coupled to a drain of the eighth FET and to a gate of the ninth FET, and sources of the eighth and ninth FETs are coupled to the second power supply rail;

a tenth FET of the first type and eleventh and twelfth FETs of the second type, wherein a gate of the tenth FET is coupled to a gate of the eleventh FET, a drain of the tenth FET is coupled to a drain of the eleventh FET and to a gate of the twelfth FET, and sources of the eleventh and twelfth FETs are coupled to the first power supply rail, wherein sources of the seventh and tenth FETs are configured to receive the second input signal of the input differential signal pair, wherein the gates of the seventh, eighth, tenth, and eleventh FETs are configured to receive the first input signal of the input differential signal pair, and wherein a drain of the ninth FET is coupled to a drain of the twelfth FET.

15. The system of claim 14, wherein the output signal is a first output signal, wherein the output terminal is a first output terminal, wherein the second signal repeater circuit further comprises a second output terminal coupled to the drains of the ninth and twelfth FETs, and wherein the second signal repeater circuit is configured to set a level of a second output signal at the second output terminal to represent an inverse of a value represented by the second input signal in response to a transition of the second input signal and a complementary transition of the first input signal.

16. The system of claim 15, further comprising an equalization circuit coupled to the output terminals of the first and second signal repeater circuits.

17. The system of claim 16, wherein the levels of the output signals are voltage levels, and wherein the equalization circuit is configured to at least partially equalize the voltage levels of the first and second output signals in response to a transition of the first input signal and prior to a complementary transition of the second input signal, and/or in response to a transition of the second input signal and prior to a complementary transition of the first input signal.

18. The system of claim 16, wherein the levels of the output signals are voltage levels, and wherein the equalization circuit is configured to at least partially equalize the voltage levels of the first and second output signals based on a determination that the first and second input signals do not represent complementary values.

19. The system of claim 16, wherein the levels of the output signals are voltage levels, and wherein the equalization circuit is configured to at least partially equalize the voltage levels of the first and second output signals during a period when the first and second input signals do not represent complementary values.

20. The system of claim 16, wherein the equalization circuit comprises a switch having a first terminal coupled to the first output terminal of the first signal repeater circuit and a second terminal coupled to the second output terminal of the second signal repeater circuit.

21. The system of claim 20, wherein the equalization circuit further comprises a driver circuit configured to control operation of the switch.

22. The system of claim 21, wherein the driver circuit is configured to activate the switch in response to transitions of the first and second input signals and prior to the signal repeater circuits changing the levels of the first and second output signals in response to the transitions of the first and second input signals.

23. The system of claim 21, wherein the driver circuit is configured to activate the switch in response to a transition of the first input signal and prior to a complementary transition of the second input signal, and/or in response to a transition of the second input signal and prior to a complementary transition of the first input signal.

24. The system of claim 23, wherein the driver circuit comprises:

thirteenth and fourteenth FETs of the first type, wherein a gate of the thirteenth FET is coupled to the second output terminal of the second signal repeater circuit, wherein a source of the thirteenth FET is configured to receive the second input signal, wherein a gate of the fourteenth FET is coupled to the first output terminal of the first signal repeater circuit, and wherein a source of the fourteenth FET is configured to receive the first input signal; and fifteenth and sixteenth FETs of the second type, wherein a gate of the fifteenth FET is configured to receive the second input signal, wherein a source of the fifteenth FET is coupled to the first output terminal of the first signal repeater circuit, wherein a gate of the sixteenth FET is configured to receive the first input signal, and wherein a source of the sixteenth FET is coupled to the second output terminal of the second signal repeater circuit, wherein drain terminals of the thirteen, fourteenth, fifteenth, and sixteenth FETs are coupled together and coupled to a control terminal of the switch.

25. The system of claim 16, wherein the equalization circuit comprises a switch having a first terminal coupled to the first input terminal of the first signal repeater circuit and a second terminal coupled to the second input terminal of the first signal repeater circuit.

26. A system, comprising:
first and second input terminals configured to receive, respectively, first and second input signals of an input differential signal pair;
means for providing, at first and second output terminals, respective first and second output signals having levels representing inverses of values represented by the first and second input signals, respectively, in response to a transition of the first input signal and a complementary transition of the second input signal; and
means for at least partially equalizing voltage levels of the first and second output signals based on a determination that the first and second input signals do not represent complementary values.

* * * * *